United States Patent

Weber et al.

Patent Number: 5,610,531
Date of Patent: Mar. 11, 1997

[54] TESTING METHOD FOR SEMICONDUCTOR CIRCUIT LEVELS

[75] Inventors: Werner Weber, Munich; Siegmar Koeppe, Laatzen; Helmut Klose, Munich; Holger Huebner, Baldham, all of Germany

[73] Assignee: Siemens Aktiengesellschaft, Munich, Germany

[21] Appl. No.: 369,391

[22] Filed: Jan. 6, 1995

[30] Foreign Application Priority Data

Jan. 11, 1994 [DE] Germany ............ 44 00 552.0

[51] Int. Cl.⁶ .................................................. G01R 31/28
[52] U.S. Cl. ........................................ 324/765; 324/158.1
[58] Field of Search ............................. 324/158.1, 763, 324/765, 754

[56] References Cited

U.S. PATENT DOCUMENTS

| | | | |
|---|---|---|---|
| 4,585,991 | 4/1986 | Reid et al. | 324/757 |
| 4,754,316 | 6/1988 | Reid | 324/765 |
| 4,921,810 | 5/1990 | Kunieda et al. | 324/158.1 |
| 4,937,203 | 1/1990 | Eichelberger et al. | 437/8 |
| 4,994,737 | 2/1991 | Carlton et al. | 324/754 |
| 5,042,133 | 8/1991 | Peterson | 324/158.1 |
| 5,222,014 | 6/1993 | Lin . | |
| 5,258,648 | 11/1993 | Lin | 257/778 |
| 5,311,122 | 5/1994 | Fullerton et al. | 324/158.1 |
| 5,315,239 | 5/1994 | Vitriol . | |
| 5,363,038 | 11/1994 | Love | 324/158.1 |

FOREIGN PATENT DOCUMENTS

| | | |
|---|---|---|
| 3608660A1 | 9/1986 | Germany . |
| 2247565A | 3/1992 | United Kingdom . |
| WO88/02549 | 4/1988 | WIPO . |
| WO90/09093 | 8/1990 | WIPO . |

*Primary Examiner*—Ernest F. Karlsen
*Attorney, Agent, or Firm*—Hill, Steadman & Simpson

[57] ABSTRACT

A function test is implemented for an individual circuit level (1) that is provided for vertical integration in a semiconductor component. Stacks of circuit levels respectively provided over or under this circuit level in the finished component are simulated as test heads (2, 3). These test heads are provided with terminal contacts for reversible contacting. The circuit level (1) under test is connected to these test heads (2, 3) during the function test, and the test heads are removed after the test.

13 Claims, 1 Drawing Sheet

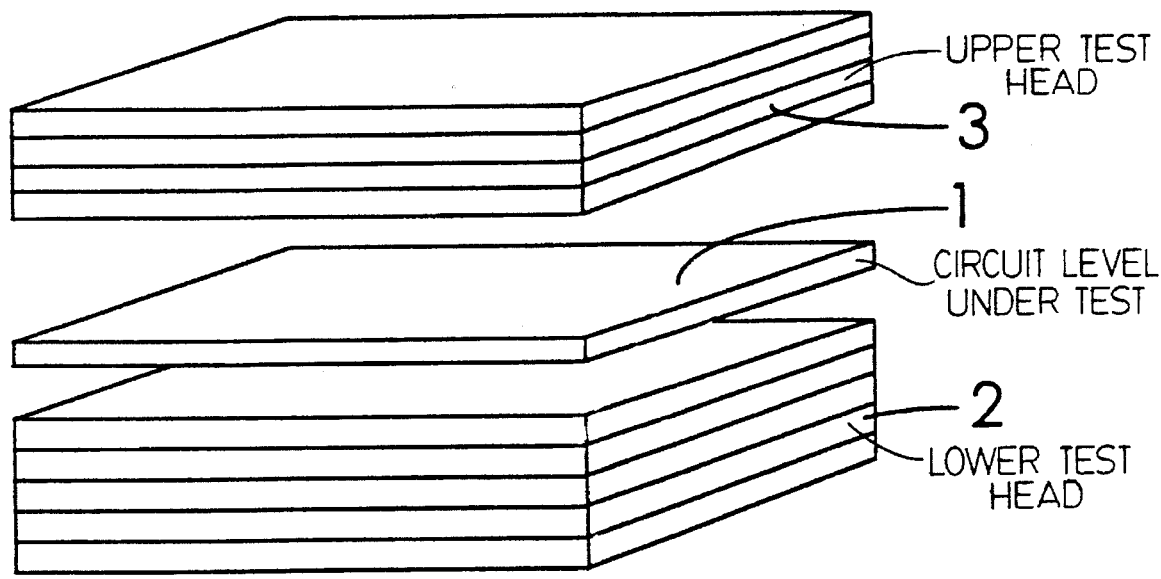

TESTING METHOD FOR SEMICONDUCTOR CIRCUIT LEVELS

BACKGROUND OF THE INVENTION

The present invention is directed to a method for the implementation of function tests at individual semiconductor circuit levels that are provided for vertical integration.

Semiconductor circuits are currently manufactured in planar technology. The complexity that can be achieved on a chip is limited by its size and by the structural fineness that can be achieved. The performance capability of a system composed of a plurality of interconnected semiconductor chips is significantly limited in conventional technology by the limited number of possible connections between individual chips via terminal contacts (pads), by the low speed of the signal transmission between different chips via such connections (interface circuits pad/printed circuit board), by the limited speed due to highly branched interconnects given complex chips, and by the high power consumption of the interface circuits.

These limitations in the use of planar technology can be overcome with three-dimensional circuit techniques. The arrangement of the function levels above one another allows parallel communication of these components with little outlay for electrically conductive connections in one level. Speed-limiting interchip connections are also avoided. Despite enhanced functionality, such a vertically integrated chip can also be accommodated in the same housing.

In order to avoid losses in the yield of functional chips, it is necessary that only circuit levels that have been tested and found fully functional are connected to one another. This is unproblematical as long as the circuit levels are a matter of, autoṁoñous, i.e. of independently functioning circuits. Given such autoṁoñous circuits, it is possible to test them on the wafer on which they are manufactured before they are separated from one another and mounted in housings. When, however, the individual circuit level only functions in interaction with the neighboring levels that are to be vertically arranged, when contacting with a probe is not possible on the wafer due to a lack of contact locations, then testing is only possible without further measures after an assembly of the circuit levels which, however, is irreversible. The yield, is then drastically reduced.

The circuits are usually contacted for testing by placing fine test probes onto the bond pads. The pads, however, have substantially larger dimensions than the connection contacts of the circuit levels provided for vertical integration. Moreover, the number of contacts is thereby, substantially greater (approximately 10,000–100,000). The fine dimensions and the high number of contact locations preclude the employment of standard test probes. Another testing method utilizes electron-optical methods. This, however, requires autoṁoñous circuit levels, a requirement that is not satisfied here. The voltage supply is not yet assured, particularly given insulated circuit levels.

SUMMARY OF THE INVENTION

It is an object of the present invention to provide a method for implementing function tests for vertically integrated semiconductor components that enables an increased yield of functional chips compared to prior art methods.

This object is achieved with the method of the present invention for implementing function tests at semiconductor circuit levels for vertically integrated semiconductor components using test heads. Each test head simulates at least a part of the functions of a stack of circuit levels provided over or under the circuit level under test in the finished semiconductor component. The test heads are provided with devices for reversibly contacting the locations at the surface of the circuit level under test that are to be electrically connected in the function test. The circuit level under test is connected to such a test head at one or both sides only during the function test.

Advantageous developments of the present invention are as follows. Test heads are employed that contain the same circuits as the stack of circuit levels present over or under the circuit level under test in the finished component. Test heads are employed that are constructed such that the arrangement of circuit level under test and test heads connected in the function test has the same properties as the finished component. Also, test heads are employed that have been produced by vertical connection of circuit levels provided for the appertaining component. Alternatively, test heads are employed that contain a partitioning of the circuit belonging to the remaining circuit levels of the appertaining component which is matched to the function test of the circuit level under test. The circuits realized in the test heads also have functions specifically provided for the function test for the circuit level under test. The test heads have these functions in addition to the simulation of functions established by stacks of circuit levels in the finished component.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

The single Figure depicts a virtually integrated semiconductor component having a plurality of circuit levels to be tested by the method of the present invention.

DESCRIPTION OF THE PREFERRED EMBODIMENT

In the method of the present invention, the individual semiconductor circuit levels are tested for function before assembly. The basic idea of the present invention is thereby to simulate the further circuit levels for this test that are to be arranged above or, respectively, below the circuit level under test in the finished component. When, for example, the finished component comprises n circuit levels vertically connected to one another and the $i^{th}$ circuit level is to be tested, the stack of the first i−1 circuit levels and the stack of the last n−i circuit levels are respectively simulated in the form of test heads. In the function test, the $i^{th}$ circuit level is reversibly connected at both sides to the corresponding test heads, whereby the terminal contacts of this circuit level are connected to respective contacts at the test heads. The contacts at the test heads are respectively fashioned such that the test heads can be easily removed from the tested circuit level after the function test. Those tested circuit levels that are functional can then be utilized for the assembly of the components.

In one simple realization of the test heads the first i−1 circuit levels of the appertaining component are assembled and a completely functional stack potentially composed of a plurality of such stacks of i−1 circuit levels is selected. Correspondingly, stacks that are composed of the last n−1 circuit levels are assembled and a fully functional stack is selected therefrom. When the terminal contacts of these stacks that face toward the circuit level to be tested are fashioned such that a reversible contacting to the circuit level under test is possible, these stacks can be directly utilized as test heads in the method of the invention.

Alternatively, it is also possible to integrate additional circuits into the test heads. For example, these circuits can be provided for specific testing purposes, for example for generating test signals. The employment of test heads that are formed of stacks of circuit levels provided for the component is schematically shown in the single Figure. The circuit level 1 under test is contacted at both sides by test heads 2, 3 that respectively contain the circuit levels for the respective side in the finished component.

The complexity of vertically integrated circuits results in the fact that the function test of even an individual level is substantially more complicated than standard two-dimensional circuits. In order to avoid a test of the entire circuit when testing an individual level, a suitable partitioning of the circuit can be undertaken. In the arrangement utilized for the method of the present invention, however, this partitioning need not necessarily be limited to a specific circuit level as required in prior art testing arrangements. It is sufficient that the test heads respectively contain only sub-functions of the circuit arranged at the appertaining side of the circuit level under test in the finished component. Specifically, such a test head can be composed, for example, of only a specific plurality of circuit levels arranged adjacent to the circuit level under test in the finished component. When testing the $i^{th}$ circuit level 1, for example, the lower test head 2 would consist of the circuit levels i–10 through i–1 and the upper test head 3 would consist of the circuit levels i+1 through i+8. Means that enable a contacting for external electrical connection are provided for testing such stacked sub-stacks (for example, contact spots on the outermost circuit levels that can be contacted with probes or bond wires). This procedure can be a significant advantage when function tests must be implemented at individual levels of components wherein function blocks are vertically arranged (for example, sensor layer having electronic data processing lying therebelow). The method of the present invention offers general advantages when a functional test is advantageous and when what is referred to as a structural test (with suitable partitioning of the overall function into sub-functions) is not meaningful. This, for example, can be the case in image processing where a test for comparing rated and actual patterns can be implemented rapidly and with little outlay.

The method of the present invention avoids the additional outlay of developing separate hardware for testing a specific vertical circuit since, of course, the entire vertical chip is always tested when the circuit level under test is supplemented by the test heads to form an overall circuit during the function test. For the same reason, the interface to the actual test equipment is the same for the test of each circuit level of a vertical chip, and this also leads to a reduction in the testing outlay.

Instead of being realized as an assembly of circuit levels provided for the component, the test heads can also be realized in some other form, for example as a two-dimensional circuit that is provided with the required terminal contacts in a region corresponding to the dimension of the circuit level to be tested. The specific terminal contacts required for the reversible contacting can be realized, for example, as liquid contacts. Given such liquid contacts, a liquid metal such as gallium is introduced, for example, into a recess whose walls are provided for a metalization. The liquid metal moistens the metalizations in order to assure good electrical conduction. The metalizations are provided with electrically conductive connections that serve the purpose of electrical connection. The liquid contacts form respective menisci projecting beyond the surface, so that a contact between the terminal surfaces of the circuit level and the liquid contacts is produced when pressed against the surface of the circuit level under test. The test heads provided with liquid contacts can be simply removed from the circuit level under test, particularly when the adhesive forces are reduced by roughening or coating the surface of the test heads. For details with respect thereto, see German patent application Serial No. P 44 00 551.2, filed Jan. 11, 1994 for a "Vorrichtung für reversible Chip-Kontaktierung".

Only one respective test head is utilized when testing the lowest or, respectively, highest circuit level of the component. In a further embodiment the circuit levels are adapted to this method of the present invention, for example as regards the fashioning of the terminal contacts and regards the minimum thickness required for adequate stability.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for implementing function tests of semiconductor circuit levels of vertically integrated semiconductor components, comprising the steps of:

providing a circuit level under test of the semiconductor circuit levels;

providing test heads having the same circuits as the stack of circuit levels present over or under the circuit level under test in the finished component, said test heads being produced by vertical connection of respective circuit levels that are provided for the semiconductor component;

simulating with each of said test heads at least a part of the functions of a stack of circuit levels provided over or under the circuit level under test;

providing the test heads with devices for reversibly contacting at locations at a surface of the circuit level under test that are to be electrically connected in a function test;

connecting at least one side of the circuit level under test to at least one test head only during the function test; and implementing the function test via said connected at least one test head.

2. The method according to claim 1, wherein said test heads have a structure such that the arrangement of the circuit level under test and said test heads that are connected in the function test has the same properties as the finished semiconductor component.

3. The method according to claim 1, wherein said test heads have a partitioning of a circuit belonging to remaining circuit levels of the semiconductor component which is matched to the function test of the circuit level under test.

4. The method according to claim 1, wherein circuits realized in said test heads have functions specifically provided for the function test of the circuit level under test, said test heads having said functions in addition to simulated functions established by stacks of circuit levels in the finished semiconductor component.

5. A method for implementing function tests of semiconductor circuit levels of vertically integrated semiconductor components, comprising the steps of:

providing at least one test head that simulates at least a part of functions of a stack of circuit levels on one side of a circuit level under test, said at least one test head having the same circuits as the stack of circuit levels on the one side of the circuit level under test in the finished semiconductor components, and said at least one test head being produced by vertical connection of respective circuit levels provided for the semiconductor component;

reversibly contacting locations on the at least one test head with locations on said one side of the circuit level under test for establishing electrical connections during a function test; and implementing the function test on the circuit level under test.

6. The method according to claim 5, wherein said method further comprises the steps of:

providing first and second test heads; and reversibly contacting the one side of the circuit level under test with the first test head and reversibly contacting the other side of the circuit level under test with the second test head.

7. The method according to claim 5, wherein said at least one test head has a structure such that the arrangement of the circuit level under test and the at least one test head has the same properties as the finished semiconductor component.

8. The method according to claim 5, wherein said at least one test head has a partitioning of a circuit belonging to remaining circuit levels of the semiconductor component which is matched to the function test of the circuit level under test.

9. The method according to claim 5, wherein circuits realized in the at least one test head has test functions specifically provided for the function test for the circuit level under test, said at least one test head having said test functions in addition to simulated functions established by the stack of circuit levels in the finished semiconductor component.

10. A method for implementing function tests of semiconductor circuit levels of vertically integrated semiconductor components, comprising the steps of:

providing a circuit level under test of the semiconductor circuit levels;

providing at least one test head that simulates at least a part of functions of a stack of circuit levels on one side of the circuit level under test, said at least one test head having the same circuits as the stack of circuit levels on the one side of the circuit level under test in the finished semiconductor component, said at least one test head being produced by vertical connection of respective circuit levels provided for the semiconductor component;

providing circuits in the at least one test head, said circuits having test functions specifically provided for a predetermined function test for the circuit level under test;

reversibly contacting locations on the at least one test head with locations on said one side of the circuit level under test for establishing electrical connections during the predetermined function test; and implementing the predetermined function test on the circuit level under test.

11. The method according to claim 10, wherein said method further comprises the steps of:

providing first and second test heads; and reversibly contacting the one side of the circuit level under test with the first test head and reversibly contacting the other side of the circuit level under test with the second test head.

12. The method according to claim 10, wherein said at least one test head has a structure such that the arrangement of the circuit level under test and the at least one test head has the same properties as the finished semiconductor component.

13. The method according to claim 10, wherein said at least one test head has a partitioning of a circuit belonging to remaining circuit levels of the semiconductor component which is matched to the function test of the circuit level under test.

* * * * *